United States Patent

Someda et al.

[11] Patent Number: 5,831,273
[45] Date of Patent: Nov. 3, 1998

[54] CHARGED PARTICLE BEAM LITHOGRAPHY METHOD AND APPARATUS THEREOF

[75] Inventors: Yasuhiro Someda, Kokubunji; Yasunari Sohda, Hachioji; Yoshinori Nakayama, Sayama; Hiroyuki Itoh, Hitachinaka, all of Japan

[73] Assignee: Hitachi, Ltd., Tokyo, Japan

[21] Appl. No.: 811,927

[22] Filed: Mar. 5, 1997

[30] Foreign Application Priority Data

Mar. 6, 1996 [JP] Japan ................................. 8-048623

[51] Int. Cl.[6] ................................................. G06F 15/46
[52] U.S. Cl. .................................. 250/492.22; 250/491.1
[58] Field of Search ........................... 250/492.22, 492.2, 250/491.1

[56] References Cited

U.S. PATENT DOCUMENTS 5,305,225   4/1994   Yamaguchi et al. ................. 250/492.3

OTHER PUBLICATIONS

Japan Society of Applied Physics and Related Societies, 42nd Spring Meeting, 1995, M. Ohno et al, 2 pages.

*Primary Examiner*—Jack I. Berman
*Attorney, Agent, or Firm*—Fay, Sharpe, Beall, Fagan, Minnich & McKee

[57] ABSTRACT

A method of adjusting a shaped beam in a charged particle beam writing method of writing a pattern on the surface of a written target using the above shaped beam is disclosed. The above method of adjusting the above shaped beam consists of a process for measuring the point of the center of the intensity of the shaped beam projected on the surface of the written target, a process for calculating a projected position correcting amount for correcting the projected position on the surface of the written target of the shaped beam based upon the measured point of the center of the intensity and a process for correcting the projected position on the surface of the written target of the shaped beam by the obtained projected position correcting amount. According to this method of correcting the projected position of the beam based upon the point of the center of the intensity of the shaped beam, a positioning error in a connection between the parts of patterns written on the surface of the written target can be greatly reduced.

18 Claims, 7 Drawing Sheets

CHARGED PARTICLE BEAM LITHOGRAPHY METHOD AND APPARATUS THEREOF

BACKGROUND OF THE INVENTION

1. Field of the Invention

The present invention relates to a charged particle beam writing (delineating) technique, and more particularly, relates to a shaped beam adjusting method and a pattern matching method included in the technique.

2. Description of the Related Art

Heretofore, a variable shaped beam method and a cell projection method have been known as an electron beam delineating method using a shaped beam, and both are normally used together for patterning upon a semiconductor device for example. That is, the cell projection method is used for patterning with a repeatable shaped pattern and the variable shaped beam method is used for patterning with a variable pattern which is not repeated. However, as the trajectory of the cell projection method and the operation method of an apparatus in the cell projection method are greatly different from those of/in the variable shaped beam method, a beam adjusting method dedicated to the cell projection method is required in addition to a beam adjusting method heretofore used for the variable shaped beam method. For example, a beam adjusting method for improving stitching (butting) between a pattern formed by the variable shaped beam method and a pattern formed by the cell projection method is required. That is, a pattern formed by the variable shaped beam method and a pattern formed by the cell projection method, or the same type or different types of patterns formed by the cell projection method, are required to be connected precisely to each other. However, when a pattern formed by the variable shaped beam method and a pattern formed by the cell projection method are connected, a little gap is formed between both patterns due to a problem in the optics design of a patternmaker and others. That is, even if a variable shaped beam and a cell pattern beam are radiated in the same position upon the surface of a target (delineated matter) based upon design data, positions in which both beams are radiated upon the surface of the target are substantially different (displaced). To solve this problem, in patterning by the cell projection method, a technique for measuring a stitching error (positioning error) of a pattern formed by the cell projection method for a pattern formed by the variable shaped beam method, substantially shifting a position to be patterned by the cell projection method based upon the result of the measurement, and stitching a pattern formed by the cell projection method and a pattern formed by the variable shaped beam method, is generally used.

For a typical example of the above stitching technique, a method published as presentation numbers 30a-S-1 (a beam adjusting method in exposing a block) and 30a-S-2 (correcting displacement upon a wafer in exposing a block) in the 42nd Spring Meeting in 1995 of the Japan Society of Applied Physics and Related Societies by M. Ohno and S. Sago, et al. can be given. In this method, the shape of a shaped beam on a wafer is measured by scanning a standard mark with a shaped beam for a selected pattern by the cell projection method, a positioning error by the cell projection method is calculated by comparing the measured shape of the beam and the shape of a pattern in design, the relative positioning error of the cell pattern beam for the position of a variable shaped beam is obtained by measuring as described above by the variable shaped beam method, and satisfactory connection between a delineated pattern (a variable shaped beam pattern) by the variable shaped beam method and a delineated pattern (a cell pattern) by the cell projection method is realized by correcting this relative stitching error.

In the meantime, a method of adjusting the axis of a beam in the cell projection method is greatly different from that in the variable shaped beam method. In the variable shaped beam method, the axis of a beam is adjusted by detecting the edge of the waveform of the beam current if a focusing point is varied. However, in the cell projection method, as the shape of a beam is arbitrary, the waveform of the beam current also varies and it is difficult to detect the edge of the waveform of the beam current. Therefore, heretofore, in adjusting the axis of a beam in the cell projection method, the position of the axis of a cell pattern beam is detected by scanning a gold dot mark with a cell pattern beam, and the axis of a beam is adjusted by adjusting the corrected deflection distance by an aligner for adjusting an axis by a cut-and-try method so that the error of the above position of the axis of a beam from the position of the optical axis of the apparatus is minimum.

In the above prior art, when the positioning error of a delineated pattern is measured with a shaped beam such as a variable shaped beam and a cell pattern beam, there is a problem that it takes a long time to specify the shape of a beam in detail and in addition, as an aperture is required to be varied in measurement and a positioning error is required to be measured and corrected every time the position of a beam is fluctuated by drift, delineating throughput is greatly deteriorated. As the axis of abeam is adjusted manually, it takes a long time to correct, and in addition, there is a limit in the precision of correction.

SUMMARY OF THE INVENTION

Therefore, an object of the present invention is to solve the above problems of the prior art and to provide a system for measuring the positioning error of a beam at high speed and precisely, even if a cell with any shape is used, and for realizing a satisfactory connection between a variable shaped beam pattern and a cell pattern, and the precise adjustment of the optical system of a cell pattern beam.

The positioning error of a shaped beam (a cell pattern beam) is obtained not by detecting the shape of a shaped beam but by detecting a typical position reflecting the property of the shape of respective beams according to the above objects. That is, according to the present invention, the point of the center of intensity distribution of a shaped beam is measured and the positioning error of a shaped beam is obtained by comparing this measured point of the center of intensity distribution with that in design. That is, the point of the center of intensity distribution of a shaped beam in each scanning direction is calculated based upon the waveform of the beam current obtained by scanning a linear mark with a shaped beam in two-dimensional directions and detecting a backscattered electron from the above mark. A positioning error between both is obtained by comparing the obtained point of the center of intensity distribution with that in design, the positioning error is corrected by applying the obtained positioning error to a correction deflector as corrected data, and substantial patterning is executed. If the axis of a beam is adjusted, it can be precisely corrected by varying the focus of a beam (so-called wobbling) and measuring the displacement of the point of the center of intensity distribution of a beam. Particularly, after the point of the center of intensity distribution of a shaped beam is calculated based upon the waveform of beam current obtained by scanning the above linear mark with a shaped beam, a correction deflector is adjusted by varying the focus of a beam so that the point of the center of intensity distribution of a shaped beam is not changed independent of this variation of the focus. The intensity of a backscattered electron from a mark in each beam position is proportional to the intensity of the beam current in each beam position, and the distribution of the intensity of the beam current in x-axis and y-axis directions can be detected by detecting the intensity of a backscattered electron from the mark. That is, the point of the center of intensity distribution of a shaped beam can be also calculated based upon that of the distribution of the intensity of a backscattered electron. In this case, the intensity of a backscattered electron is detected; however, a secondary electron or a transmitted electron may be used instead. (hereinafter, if a backscattered electron is described, it includes a secondary electron). Further precise patterning is enabled by applying correction to a correction deflector by remeasuring the above positioning error at fixed intervals and for every stripe in view of the drift of the above positioning error during patterning.

Further objects, constitution, actions and effects of the present invention will be clarified in order in detailed description of embodiments described below.

DETAILED DESCRIPTION OF THE PREFERRED EMBODIMENTS

Figure 1:
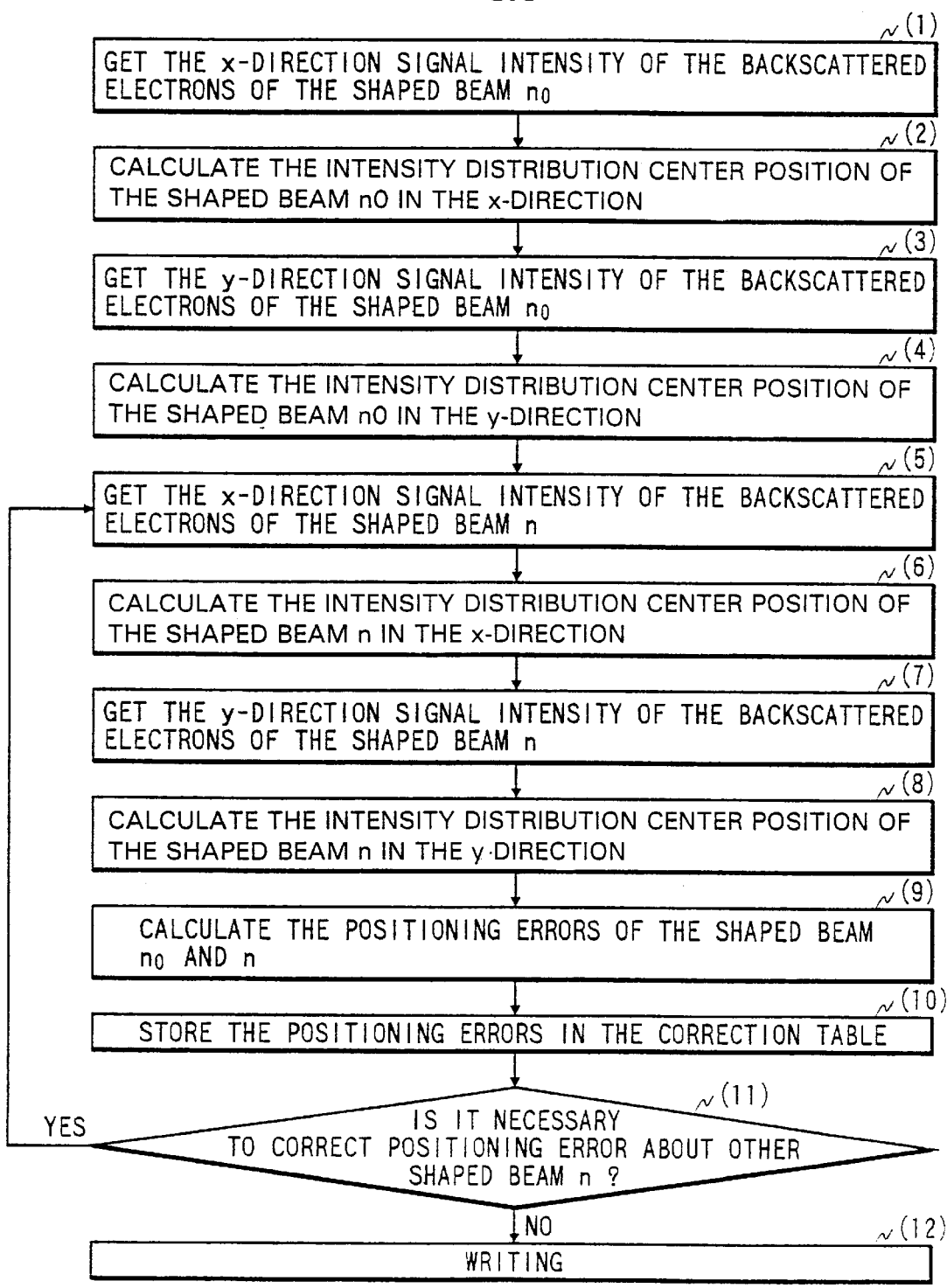
FIG. 1 is a flowchart showing the procedure of measurement and correction in a first embodiment according to the present invention.

Referring to the drawings, embodiments according to the present invention will be described in detail below.

First Embodiment

In this embodiment, a positioning error in the connection of a variable shaped beam pattern and a cell pattern is measured and corrected by first measuring the point of the center of intensity distribution of a shaped beam. FIG. 1 is a flowchart showing a measurement and correction process in this embodiment and FIG. 2 shows the schematic constitution of an electron-beam lithography apparatus used in this embodiment.

Figure 2:
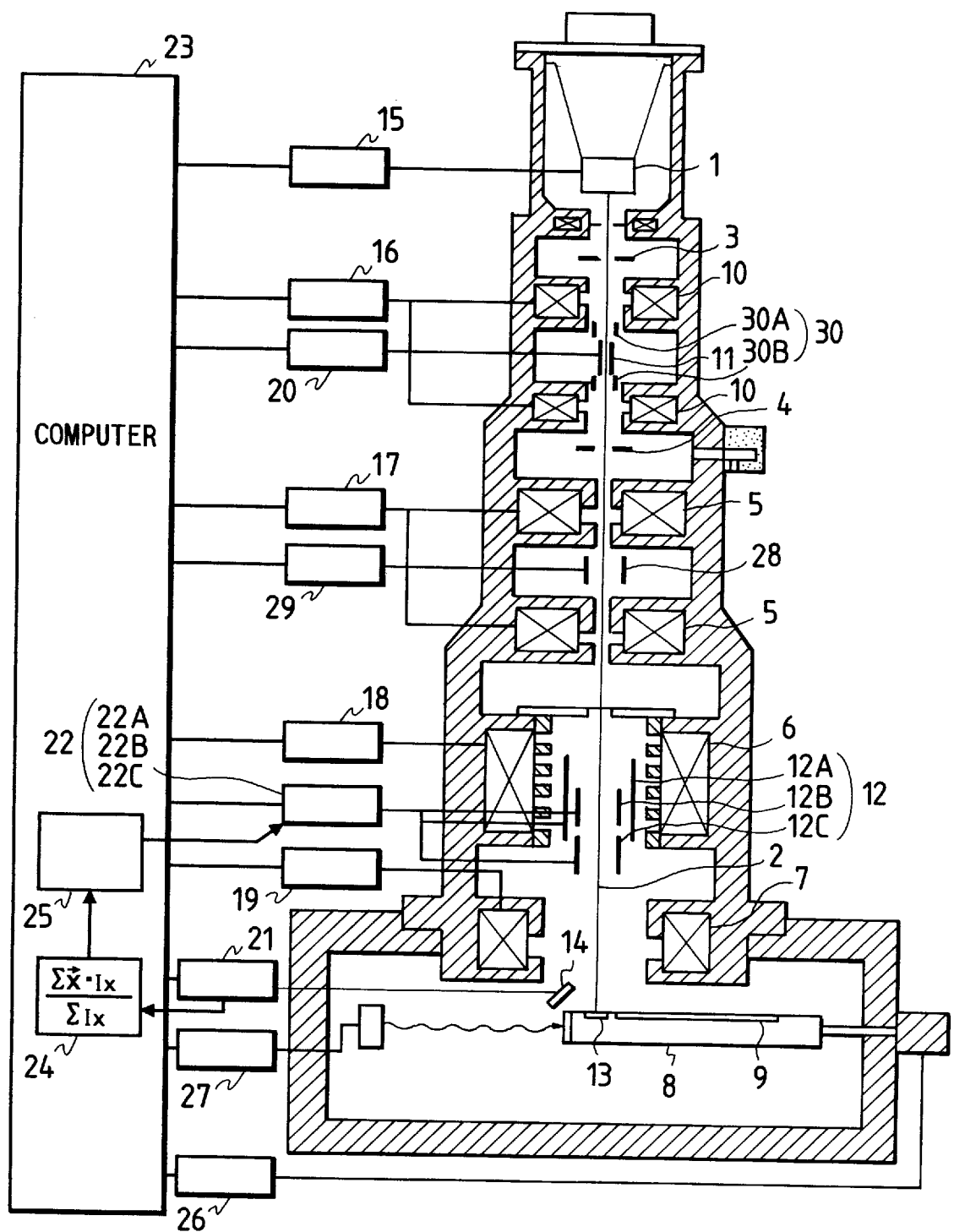
FIG. 2 is a schematic block diagram showing an electron-beam lithography apparatus used in the first, second, fourth and fifth embodiments according to the present invention.

As shown in FIG. 2, after an electron beam 2 radiated from an electron gun 1 is formed into a shaped beam (a variable shaped beam with a rectangular section or a cell pattern beam with an arbitrary section) through shaping apertures provided through a first mask 3 and a second mask 4, the electron beam is demagnified and projected on the surface of a target (a delineated matter) 9 laid on a stage 8 via a demagnification lens 5 and first and second objective lenses 6 and 7, whereby desired and desired patterning (exposure) is executed.

A projection lens 10 is provided between the first and second masks 3 and 4 for demagnifying and projecting a beam which passes through the aperture of the first mask 3 on the surface of the second mask 4. One rectangular aperture is normally provided to the first mask 3, and plural apertures for forming a variable shaped beam and plural apertures for forming a cell pattern beam are normally provided to the second mask 4. The shape of a pattern to be delineated on the surface of the target 9 is selected by deflecting a beam which passes through the rectangular aperture of the first mask 3 on the surface of the second mask 4 using a shaping deflector 11 and radiating the rectangular aperture image of the first mask 3 on any one aperture provided on the second mask 4. That is, a variable shaped beam in the desired shape with a desired dimension is formed by radiating the rectangular aperture image of the first mask 3 on any one aperture for forming a variable shaped beam on the second mask 4, and adjusting the overlapped area. A cell pattern beam is formed by radiating the rectangular aperture image of the first mask 3 on any one aperture for forming a cell pattern beam on the second mask 4. The position to be patterned on the surface of the target 9 is selected using a 3-stage deflection system 12 consisting of a main deflector 12A, a sub-deflector 12B and a sub-sub deflector 12C respectively provided between the first and second objective lenses 6 and 7.

The distribution of the intensity of the beam current on the surface of the target 9 is measured by scanning a linear tungsten mark 13 provided on the same plane as the surface of the target 9 with the above shaped beam (a variable shaped beam or a cell pattern beam) and detecting a backscattered electron from the mark 13 by a detector 14.

In FIG. 2, a reference number 15 denotes a power source for the electron gun, 16 denotes a power source for the projection lenses, 17 denotes a power source for the demagnification lenses, 18 and 19 respectively denote power sources for the first and second objective lenses, 20 denotes a power source for the shaping deflector, 21 denotes a power source for the detector, and 22 denotes a power source for the deflection system including a power source 22A for the main deflector, a power source 22B for the sub-deflector and a power source 22C for the sub-sub deflector. These power sources control the respective corresponding control targets when receiving a control signal from a computer 23.

Next, the flow of measurement and correction shown in FIG. 1 will be described.

(1) First, the mark 13 is scanned with a shaped beam (a variable shaped beam) $n_0$ in the direction of an x-axis, a backscattered electron from the mark 13 is detected by the detector 14 and the backscattered electron intensity signal of the shaped beam $n_0$ in the x-axis direction is obtained.

(2) The point of the center of intensity distribution of the shaped beam $n_0$ in the x-axis direction is calculated based upon the backscattered electron intensity signal obtained in the above (1) by a calculator 24 in the computer 23.

(3) The mark 13 is scanned in the direction of a y-axis with the shaped beam $n_0$ and the backscattered electron intensity signal of the shaped beam $n_0$ in the y-axis direction is obtained.

(4) The point of the center of intensity distribution of the shaped beam $n_0$ in the direction of the y-axis is calculated based upon the backscattered electron intensity signal obtained in the above (3) by the calculator 24.

(5) Next, a mark 13 is scanned in the x-axis direction with a shaped beam (a cell pattern beam) n, a backscattered electron from the mark 13 is detected by the detector 14 and the backscattered electron intensity signal of the shaped beam n in the x-axis direction is obtained.

(6) The point of the center of intensity distribution of the shaped beam n in the x-axis direction is calculated based upon the backscattered electron intensity signal obtained in the above (5) by the calculator 24.

(7) The mark 13 is scanned in the y-axis direction with the shaped beam n and the backscattered electron intensity signal of the shaped beam n in the y-axis direction is obtained.

(8) The point of the center of intensity distribution of the shaped beam n in the y-axis direction is calculated based upon the backscattered electron intensity signal obtained in the above (7) by the calculator 24.

(9) A relative positioning error between the variable shaped beam $n_0$ and the cell pattern beam n is calculated by the calculator 24 based upon the point of the center of intensity distribution of the shaped beam (the variable shaped beam) $n_0$ in the directions of x- and y-axes, the point of the center of intensity distribution of the shaped beam (the cell pattern beam) n in the directions of the x- and y-axes respectively actually measured in the above (1) to (8) and their designed values.

(10) The relative positioning error obtained in the above (9) is stored in a correction table 25 in the computer 23 as a beam position corrected quantity (deflected corrected quantity).

(11) It is judged whether correcting the beam position of the shaped beam (the cell pattern beam) n (which is different from the above) is required or not. If the correction is judged to be required, then processing is returned to the above (5) and measurement is continued. However, the correction is judged not to be required, then processing proceeds to the next (12) and patterning is actually executed.

(12) As described above, after the quantity in which a positioning error is to be corrected for realizing satisfactory connection between a pattern formed by the shaped beam (the variable shaped beam) $n_0$ and a pattern formed by the shaped beam (the cell pattern beam) n is obtained, patterning is actually executed using both shaped beams $n_0$ and n.

Figure 3A:
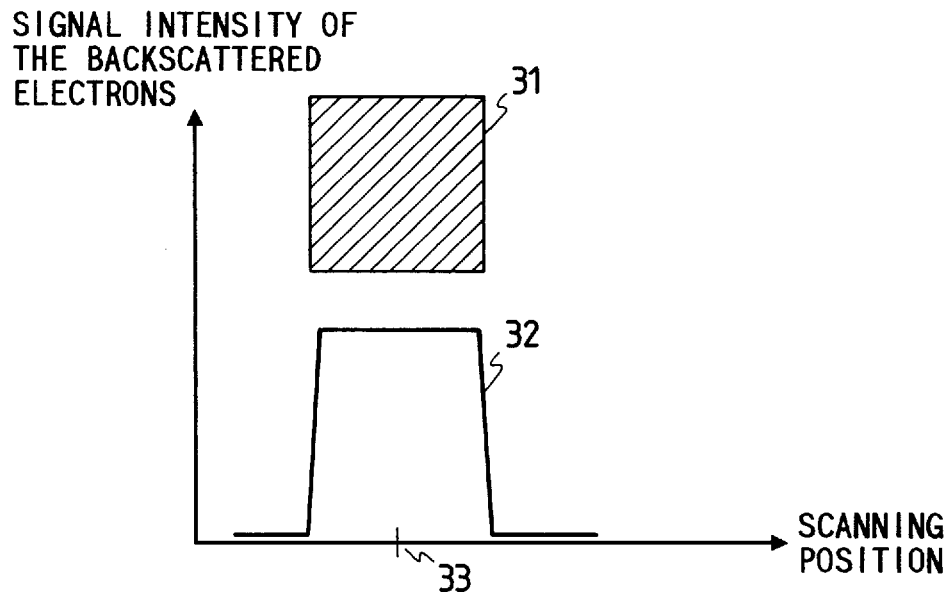
FIGS. 3A and 3B respectively show the waveform of a beam current (the waveform of a backscattered electron signal) of a variable shaped beam and a cell pattern beam for explaining the first, the second and the fourth embodiments according to the present invention.
Figure 3B:
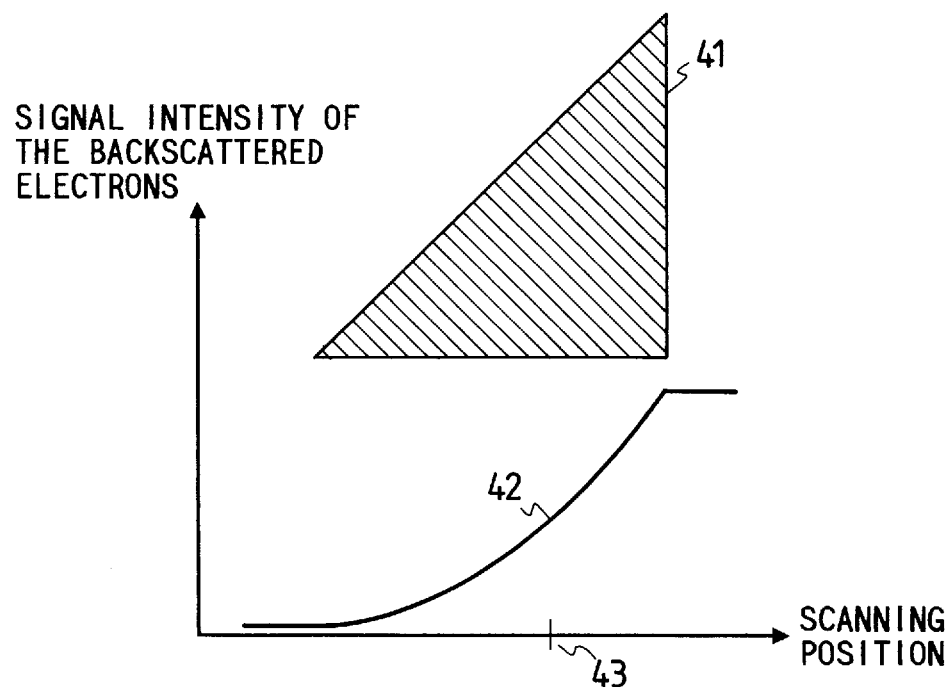

In this embodiment, a variable shaped beam is related to the shaped beam $n_0$ and a cell pattern beam is related to the shaped beam n in the flow of measurement and correction shown in FIG. 1. The point of the center of intensity distribution of both shaped beams $n_0$ and n is detected by operating the differential waveform of a signal (a backscattered electron signal, that is, the beam current) output from the detector 14 obtained by scanning the mark 13 in the directions of the x- and y-axes, intermittently radiating (shooting) the respective shaped beams on the surface of the target 9 and obtaining the point of the center of intensity distribution of a beam current waveform based upon the signal intensity of a backscattered electron from the mark 13 in each shot and the interval of a shot (that is, deflection distance). The waveform of a backscattered electron signal obtained from the detector 14 varies depending upon the shape of the shaped beam used; however, as shown in FIGS. 3A and 3B, the standard position of any backscattered electron signal waveform can be obtained by detecting the points of the center of intensity distribution 33 and 43 of a backscattered electron signal waveform. The point of the center of intensity distribution of each backscattered electron signal waveform is calculated using the following expressions (1) and (2):

$$Gx = S(X \cdot I_X)/SI_X \quad (1)$$

$$Gy = S(Y \cdot I_Y)/SI_Y \quad (2)$$

Gx and Gy are respectively the point of the center of intensity distribution in the directions of x- and y-axes, X and Y are respectively a beam position in the x- and y-axes directions and $I_X$ and $I_Y$ are respectively the signal intensity of a backscattered electron in the beam positions X and Y. As the intensity of a backscattered electron in the beam positions X and Y is proportional to the intensity of the beam current in the beam positions X and Y, the distribution of the intensity of the beam current in the x- and y-axes directions can be measured by measuring the distribution of the intensity of this backscattered electron. Therefore, the point of the center of intensity distribution of the beam current intensity distribution can be also obtained as that of the backscattered electron intensity distribution.

The point of the center of intensity distribution of both beams can be obtained by performing the above measurement for a cell pattern beam n and a variable shaped beam $n_0$. The point of the center of intensity distribution of a cell pattern beam and a variable shaped beam is different from the respective center points; however, the distance between both can be calculated based upon data in design. The above center point means the point of the center of intensity distribution of a variable shaped beam in the shot of the maximum pattern. If the distance between the center of intensity distribution and the center of a cell pattern beam in design is Rxc and Ryc, the distance between the center of intensity distribution and the center of a variable shaped beam in design is Rxv and Ryv, the point of the center of intensity distribution of an actually measured cell pattern beam is Gxc and Gyc, and the point of the center of intensity distribution of an actually measured variable shaped beam is Gxv and Gyv, the positioning error of the cell pattern beam for the variable shaped beam is expressed in the following expressions (3) and (4):

$$Dx = (Gxc - Rxc) - (Gxv - Rxv) \quad (3)$$

$$Dy = (Gyc - Ryc) - (Gyv - Ryv) \quad (4)$$

Dx and Dy respectively denote a positioning error (an error from the center point) in the x- and y-axes directions. The obtained positioning error is stored in the correction table 25 in the computer 23 as a deflection correction amount when a cell pattern is delineated. If plural cell patterns are used, the above correction amount of the respective cell patterns is measured and stored in the correction table 25. The above procedure of operation is related to the connection of a variable shaped beam pattern; and a cell pattern, however, in the other case, after the above point of the center of intensity distribution is measured at least twice, and the difference between the measured points of the center of intensity distribution and the difference between the points of the center of intensity distribution in design are obtained, a corrected amount can be also obtained by subtracting the difference between the above points of the center of intensity distribution in design from the difference between the above measured points of the center of intensity distribution.

The positioning error of a cell pattern beam for a variable shaped beam is measured using the above system. The used variable shaped beam is provided with a sectional pattern 31 in the shape of a square (1 μm square) as shown in FIG. 3A, and the cell pattern beam is provided with a sectional pattern 41 in the shape of a triangle as shown in FIG. 3B. As a result of respectively scanning the linear mark 13 with both beams and detecting a backscattered electron from the mark by the detector 14, detected signal waveforms 32 and 42 shown in FIGS. 3A and 3B can be obtained. As a result of obtaining the points 33 and 43 of the center of intensity distribution of the respective waveforms using the expressions (1) and (2) and further, obtaining the positioning error of the cell pattern beam (the triangular beam) 41 for the variable shaped beam (the square beam) 31 according to the expressions (3) and (4), the positioning error of "Dx=0.04 μm" in the transverse direction (the x-axis direction) and "Dy=0.05 μm" in the longitudinal direction (the y-axis direction) is calculated. This calculated error is stored in the correction table 25 in the computer 23.

Figure 4:
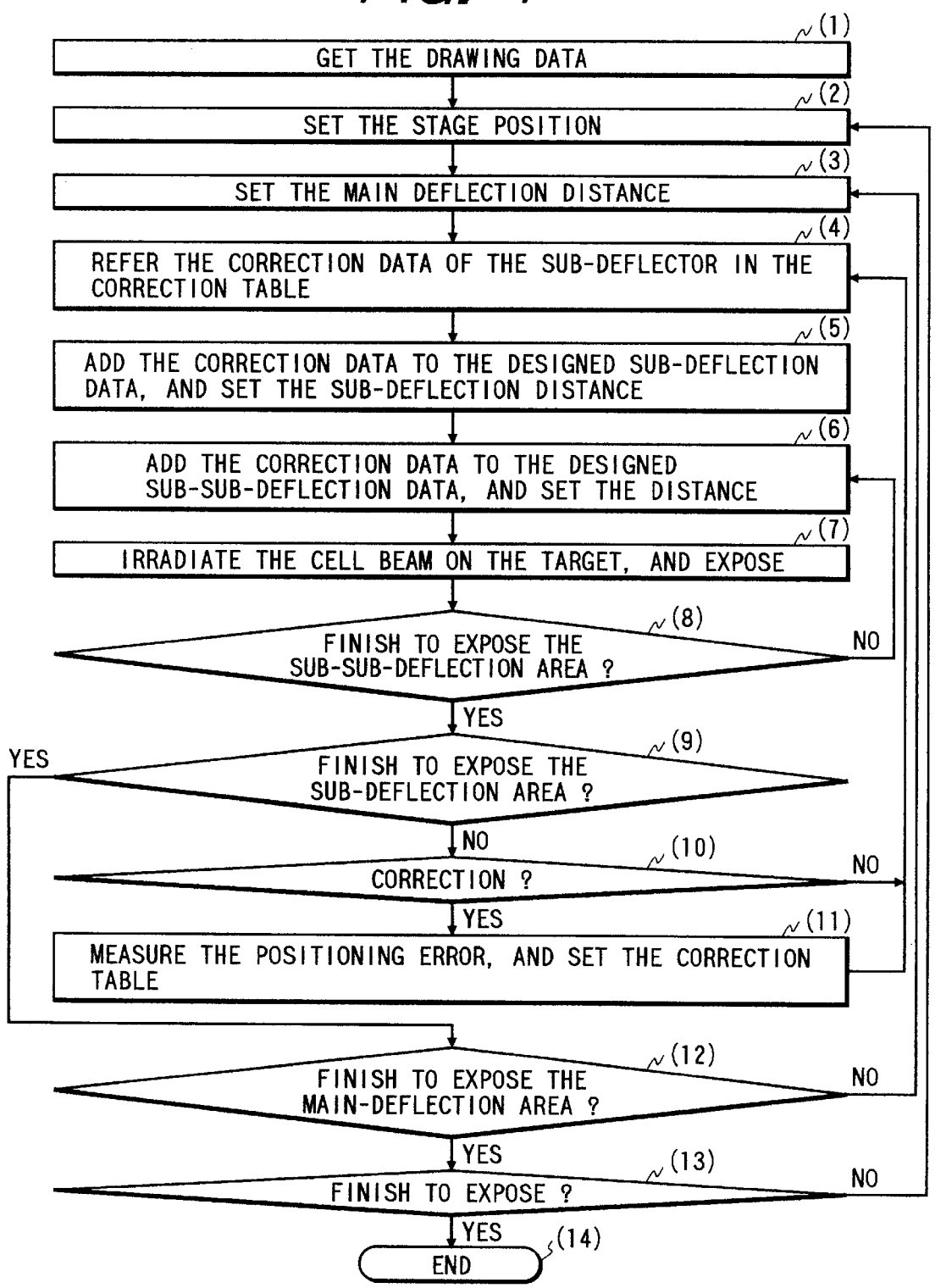
FIG. 4 is a flowchart showing a delineating procedure in the first embodiment according to the present invention.

In actual patterning, the position of a beam is corrected by shifting the shot position of a cell pattern beam by the error stored in the correction table 25. FIG. 4 shows the flow of correcting the position of a beam in patterning. The position of a beam is corrected by shifting the sub-deflection amount of a cell pattern beam by a deflection correction amount obtained by the measurement of the above positioning error in selecting a cell pattern performed prior to a sub-deflection process using the sub-deflector 12B.

The patterning flow shown in FIG. 4 will be described below.

(1) First, patterning data in design of a pattern to be delineated on the surface of the target (the delineated matter) 9 is obtained and input to the computer 23.

(2) A signal is sent to a stage driving unit 26 according to the patterning data input in the above (1) so as to position a stage 8 on which the target 9 is laid in a required position.

(3) The main deflection amount of a beam by the main deflector 12A is set depending upon the position for a pattern to be delineated on the surface of the target 9.

(4) The corrected deflection amount of a cell pattern corresponding to the part of a pattern to be delineated by a cell pattern beam of the whole pattern to be delineated is fetched from the correction table 25.

(5) A sub-deflection amount required when an actual pattern is delineated by a cell pattern beam is set by adding the corrected deflection amount fetched from the correction table 25 to a sub-deflection amount in design by the sub-deflector 12B.

(6) An actually required sub-sub deflection is set by adding a stage position follow-up amount obtained from a laser measurement system 27 for measuring the precise position of the stage 8 to a sub-sub deflection amount in design by the sub-sub deflector 12C.

(7) After the above three types of deflection amounts are corrected and set, desired patterning (exposure) is executed by radiating an actually formed shaped beam on the surface of the target 9.

(8) When patterning in all sub-sub deflection areas is completed by setting the sub-sub deflected amount of the predetermined number of sub-sub deflection areas in order and repeating patterning and correcting, processing proceeds to the next step (9).

(9) Next, when patterning is completed in all sub-deflection areas by setting the sub-deflected amount of the predetermined number of sub-deflection areas and repeating patterning and correcting, processing proceeds to the next step (12).

(10) In patterning in the above sub-deflection areas, it is judged whether a sub-deflection amount is required to be corrected again prior to patterning in the respective sub-deflection areas. If is judged that recorrection is not required, processing is immediately returned to the above step (4) and the next sub-deflection area is patterned. However, if it is judged that recorrection is required, processing proceeds to the next step (11) to reset a sub-deflection amount.

(11) If it is judged that the recorrection of a sub-deflection amount is required in the above step (10), the above positioning error (the corrected deflection amount) of a cell pattern beam is measured again, the contents of the correction table 25 are modified and the next sub-deflection area is patterned.

(12) As described above, when patterning in all sub-deflection areas in one main deflection area is completed, processing proceeds to the next patterning in the main deflection area, the main deflection amount of the predetermined number of main deflection areas is set in order, and patterning is repeated and correcting, when patterning in all the main deflection areas is completed, processing proceeds to the next step (13).

(13) It is judged whether the above similar patterning is repeated in yet another area on the surface of the target 9 and after processing is returned to the above step (2) and the position of the stage 8 is set again, if the above patterning is repeated, a new patterning area is patterned as described above.

(14) If it is determined in the above step (13) that all patterning processes are finished, patterning is finished via a predetermined measure for finishing patterning.

Further precise patterning is enabled by measuring the above positioning error at fixed intervals and stipes and correcting the position of a beam in view of the drift of a positioning error during patterning. To correct the position of a beam by shifting by this sub-deflection amount, the above deflection amount (deflection corrected amount) is added to a proper sub-deflection amount (in design) using the sub-deflector 12B. FIG. 4 shows the flow of patterning according to a step-and-repeat system; however, if a drawing method by continuous stage movement (a method for patterning, continuously moving the stage 8) is adopted, a main deflection area is striped. As a result of actually delineating a pattern in which a cell pattern and a variable shaped beam pattern are mixed using this system, a positioning error in the connection of the variable shaped beam pattern and the cell pattern can be reduced to 0.02 μm or less and precise patterning can be realized.

In this embodiment, the position of a cell pattern beam is corrected by comparing the positional relationship between the center of intensity distribution of a variable shaped beam and a cell pattern beam; however, a the similar effect can be also obtained by setting the standard point to the edge point, the center point and any other characteristic point of a variable shaped beam, for example, and comparing the relationship between this standard point of a variable shaped beam and the point of the center of intensity distribution of a cell pattern beam.

Second Embodiment

Figure 5A:
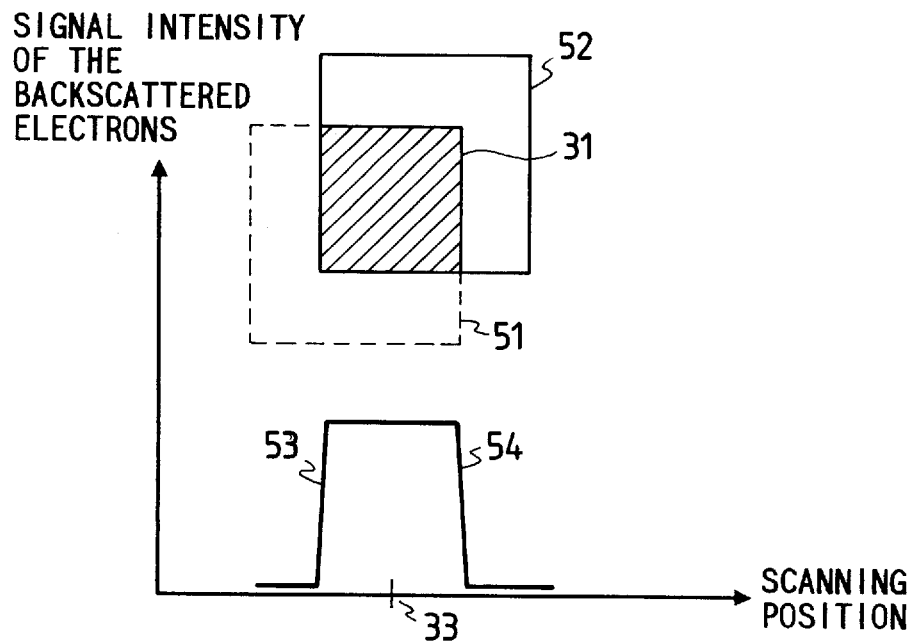
FIGS. 5A and 5B show the waveform of a beam current (the waveform of a backscattered electron signal) of a variable shaped beam for explaining the second embodiment according to the present invention.
Figure 5B:
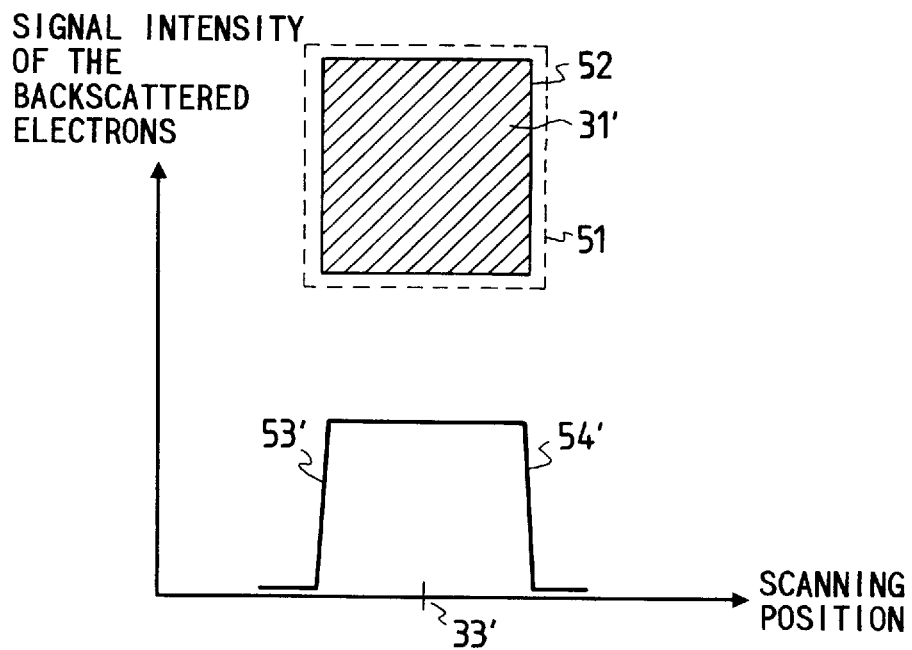

In the first embodiment, a variable shaped beam with arbitrary size is used and the standard point is set; however, in this embodiment, an example in which a variable shaped beam with the maximum size is used is shown. FIG. 5A shows the aperture image of the first mask 3 on the second mask 4 if a beam with arbitrary size is used, and FIG. 5B shows the aperture image of the first mask 3 on the second mask 4 if a beam with the maximum size is used. In the first embodiment, if the point of the center of intensity distribution of a variable shaped beam is detected, the size of the variable shaped beam 31 is determined by the beam cross section of a part in which a first mask image 51 on the second mask 4 and an aperture 52 for variable shaping in the second mask 4 are overlapped as shown in FIG. 5A. That is, one beam edge 53 of the variable shaped beam 31 is determined by the end of the aperture of the second mask 4 and the other beam edge 54 is determined by the end of the aperture of the first mask 3. Therefore, a difference may be made between beam size in design and actual beam size due to the residual error in beam size and others. As a result, an error is made in Rxv and Ryv in the expressions (3) and (4) in the first embodiment and this causes a positioning error in the connection of a pattern formed by a cell pattern beam and a pattern formed by a variable shaped beam. In this embodiment, the maximum rectangular beam is used for a variable shaped beam. In this case, the first mask image 51 on the second mask 4 completely covers the aperture 52 for variable shaping in the second mask 4 as shown in FIG. 5B and the beam edges 53' and 54' of an obtained variable shaped beam 31' are both determined by the end of the aperture 52 for variable shaping in the second mask 4. Therefore, the size of an actually obtained variable shaped beam 31' is equal to that in design and the point of the center of intensity distribution is completely equal to that (the center point) in design. This means that Rxv=Ryv=0 and hereby, an uncertain element of the point of the center of intensity distribution of a variable shaped beam is removed. Further, as beam size is maximum and the intensity of a detected signal is also maximum, the detected S/N ratio is the most satisfactory.

As a result of detecting a positioning error between a variable shaped beam and a cell pattern beam using this system, the positioning error of 0.045 μm in the transverse direction (the x-axis direction) and 0.04 μm in the longitudinal direction (the y-axis direction) is detected. As in the first embodiment, as a result of correcting a position for a cell pattern to be delineated based upon this detected results and patterning, precise patterning in which a positioning error in the connection of a variable shaped beam pattern and a cell pattern is reduced to 0.015 μm or less can be realized.

Third Embodiment

Figure 8:
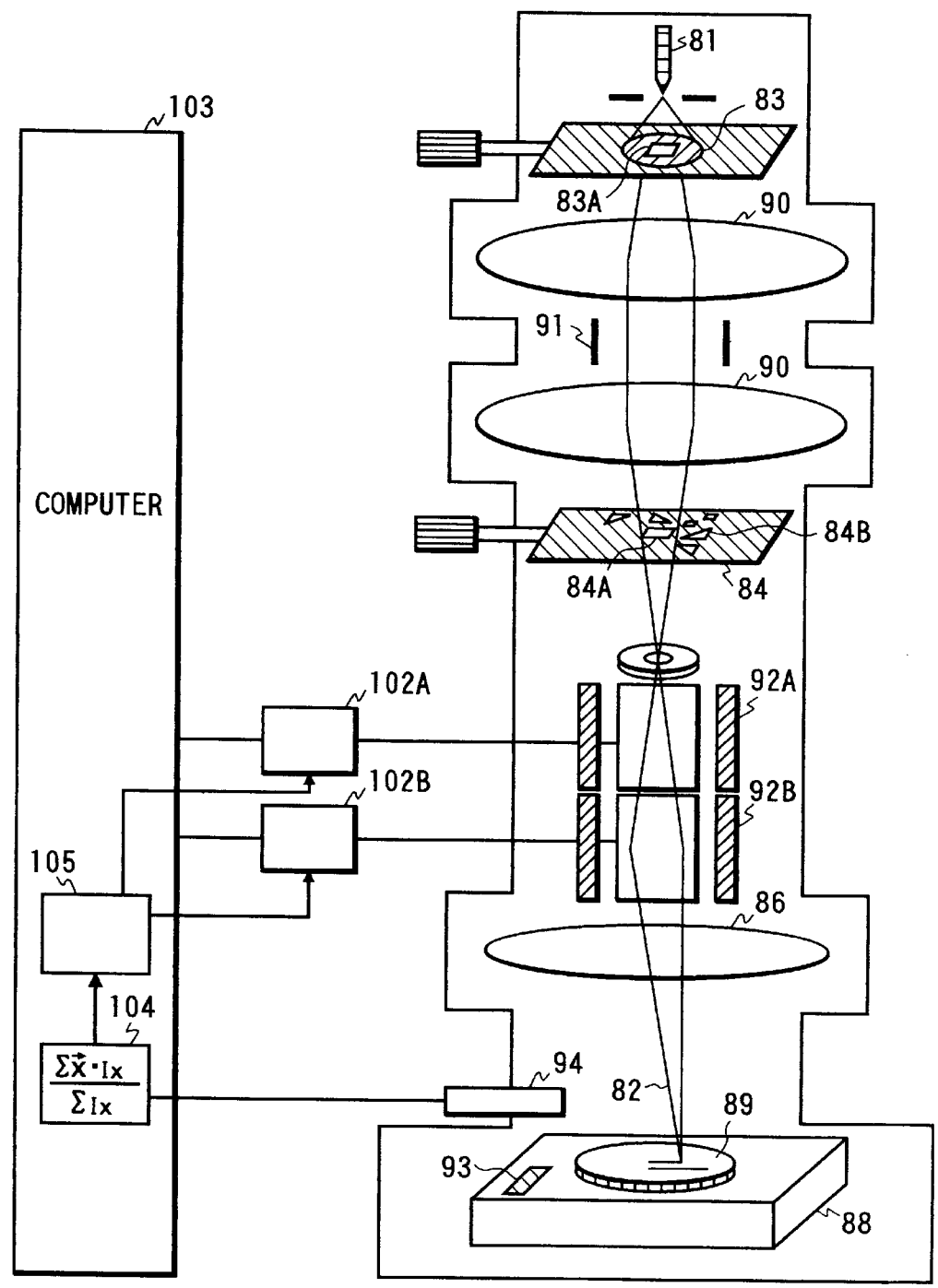
FIG. 8 is a schematic block diagram showing a focused ion beam apparatus used in a third embodiment according to the present invention.

In the above first and second embodiments, a case in which a positioning error correction method according to the present invention is applied for adjusting the patterning position of a cell pattern by an electron beam delineating apparatus is described; however, in this embodiment a case in which a similar positioning error correction method is applied to a focused ion beam apparatus shown in FIG. 8 will be described. As shown in FIG. 8, after an ion beam 82 radiated from an ion gun 81 is formed in the shape of a rectangular cross section through the rectangular aperture 83A of a first mask 83, the ion beam is projected on a second mask 84 through a projection lens 90. After the ion beam is formed in the shape of a rectangle through a rectangular aperture 84A for forming a variable shaped beam or in the shape of a cell pattern beam through a cell aperture 84B for forming a cell pattern beam respectively provided on the second mask 84, the ion beam is projected on the surface of a target 89 laid on a stage 88 through an objective lens 86 and exposure (patterning) is executed. The cross sectional shape of the beam is selected by deflecting an ion beam 82 on the surface of the second mask 84 by a projection deflector 91. The distribution of the beam current is detected by scanning a linear tungsten mark 93 provided on the same plane as the target 89 with an ion beam 82, detecting a backscattered particle from the mark 93 by a detector 94 and calculating the point of the center of intensity distribution of this detected signal waveform by a calculator 104. In this embodiment, a variable shaped beam is used in place of the shaped beam $n_0$ and a cell pattern beam is used in place of the shaped beam n, respectively, in the flowchart shown in FIG. 1. A backscattered particle signal waveform obtained by detecting a backscattered particle varies depending upon the sectional shape of a used shaped beam; however, the standard point of any backscattered particle signal waveform can be precisely detected by detecting the point of the center of intensity distribution of the backscattered particle signal waveform.

The respective positioning errors of a cell pattern and a variable shaped beam pattern are measured and corrected using the focused ion beam apparatus. The method of measurement and correction is the same as in the first embodiment. As a result of measuring the position of a beam, the positioning errors of 0.05 μm in the longitudinal (y-axis) direction and 0.04 μm in the transverse (x-axis) direction are obtained. The obtained positioning errors are stored in a correction table 105 in a computer 103 and in actual patterning, deflecting voltage supplied from power sources for deflectors 102A and 102B to deflectors 92A and 92B is corrected, the position of the shot of a shaped ion beam 82 on the surface of the target 89 is shifted by the positioning error stored in the correction table 105 from the position of a shot in design, and patterning is executed. As a result of delineating a pattern in which a part of a variable shaped beam pattern and a part of a cell pattern are mixed using this method, precise patterning in which a positioning error in the connection of the part of the variable shaped beam pattern and the part of the cell pattern is reduced to 0.02 μm or less can be realized.

Fourth Embodiment

Figure 6:
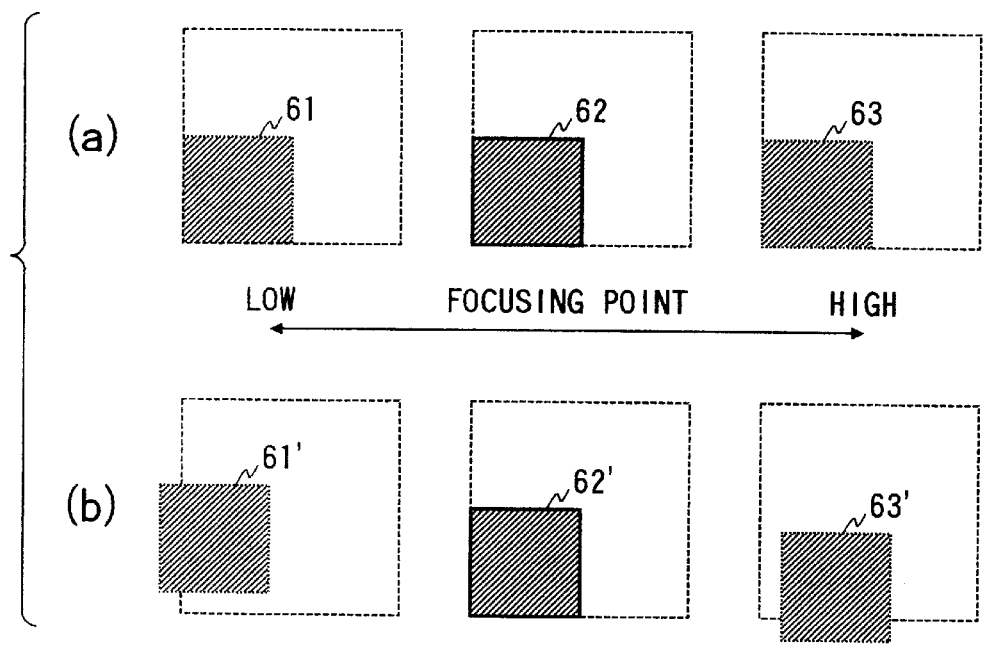
FIG. 6 shows the change of the position of a variable shaped beam for explaining the fourth embodiment according to the present invention.

In the above first and second embodiments, the point of the center of intensity distribution of a shaped beam (a variable shaped beam and a cell pattern beam) is measured and the position of a cell pattern beam is adjusted; however, in this embodiment, a case in which the measurement of the point of the center of intensity distribution is applied for adjusting the axis of a beam will be described. As shown in FIG. 6 (a), if the axis of a beam is matched with the optical axis of an apparatus, the position of images 61, 62 and 63 on the surface of the target is not shifted even if the focal position of the beam is shifted; however, if the axis of a beam is off from the optical axis of an apparatus, the positions of images 61', 62' and 63' on the surface of the target are shifted as shown in FIG. 6 (b) when the focal position of a beam is shifted. Accordingly, a method utilizing this property according to the present invention is used for detecting the position of a beam on a target. Particularly, after the point of the center of intensity distribution of a beam waveform is obtained, the focal position of the beam is shifted and a beam deflecting system is adjusted so that the point of the center of the gravity of a shaped beam on the target is not shifted independent of the above change of the focal position of the beam. A variable shaped beam 2.5 μm square is used for a beam. A beam current waveform is measured by scanning a tungsten mark 13 with the beam and detecting a backscattered electron from the mark 13. The point of the center of intensity distribution of the measured beam current waveform is calculated. Next, the point of the center of the gravity of the beam is similarly measured by shifting the focal position by 1% by shifting the excitation current of objective lenses 6 and 7 by 1%. The deflecting voltage is set to a deflecting voltage value which does not change the position of a beam independent of the above change of the focal position by performing the above operation, changing the value of deflecting voltage supplied from a deflecting power source 29 to a beam aligner 28. As a result of adjusting the axis of a beam using this method, a great reduction of time and the enhancement of precision, such as an adjustment time of approximately 30 seconds and an adjusting precision is 0.1 mrad or less, can be obtained, although heretofore, the time required for adjustment has been approximately 3 minutes and adjusting precision has been approximately 1 mrad when the axis of the beam was adjusted manually.

Fifth Embodiment

In the above fourth embodiment, the optical axis of a variable shaped beam is adjusted using the beam aligner 28; however, in this embodiment, a case in which the axis of a cell pattern beam is adjusted will be described. A cell pattern is selected by using a projection deflector 30 constituted by upper and lower stages shown in FIG. 2 and deflecting a beam through the aperture of a first mask 3. The deflecting voltage of the upper and lower deflectors 30A and 30B of this projection deflector 30 constituted by two stages is substantially equal, and if the axis of a beam is matched with the optical axis of an apparatus, the center of the deflection of the upper and lower deflectors 30A and 30B is matched with that of a shaping deflector 11 for shaping a beam. As the centers of the deflection of the shaping deflector 11 and the projection deflector 30 are not matched if the axis of a beam is off from the optical axis of the apparatus, the centers of deflection are matched by changing the ratio of deflecting voltage of the upper and lower deflectors 30A and 30B.

Figure 7:
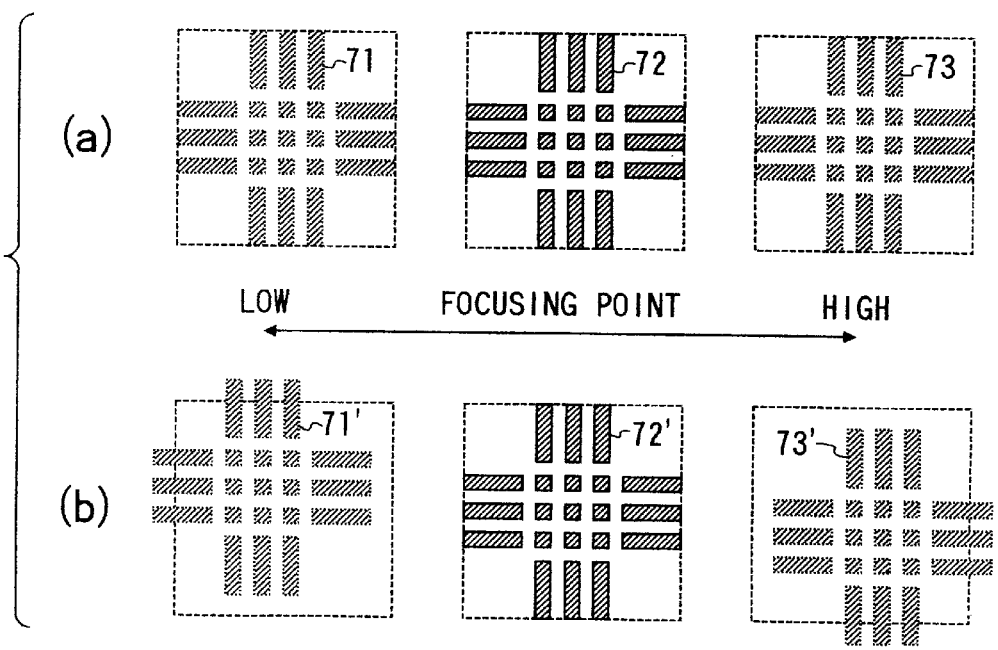
FIG. 7 shows the change of the position of a cell pattern beam for explaining the fifth embodiment according to the present invention.

The axis of a cell pattern beam is adjusted using the above method. As in the fourth embodiment, in the case of a cell pattern beam, if the axis of such a beam is matched with the optical axis of the apparatus, beam positions 71, 72 and 73 are not also shifted as shown in FIG. 7, even if the excitation current of objective lenses 6 and 7 is changed and the focal position of such a beam is changed. However, if the axis of such a beam is off from the optical axis of the apparatus, beam positions 71', 72' and 73' are shifted when the focal position is shifted. Therefore, the excitation current of the objective lenses 6 and 7 is changed, changing the deflecting voltage ratio of the upper and lower projection deflectors 30A and 30B; the focal position of such a beam is changed, a deflecting voltage ratio which does not change the position of the beam independent of the change of the focal position of the beam is obtained, and the axis of a cell pattern beam can be adjusted by holding the obtained deflecting voltage ratio. As a result of adjusting the axis of a cell pattern beam using this method, the operation for adjusting the axis of a cell pattern beam is automated and the time required for adjustment can be greatly reduced to approximately 3 minutes, although the required for adjustment is approximately 20 minutes if, as was the case heretofore, the axis is adjusted manually. Although heretofore, the precision for adjusting the axis was approximately 1 mrad, the precision can be enhanced up to 0.1 mrad or less according to the present embodiment.

In the above embodiments, an example in which the point of the center of intensity distribution of a shaped beam is measured, the position of a cell pattern beam is corrected and the axes of a variable shaped beam and a cell pattern beam are adjusted is described; however, the change of the position of a shaped beam and others are detected by utilizing the point of the center of intensity distribution of the shaped beam as a standard point in addition to the correction and adjustment of these, and can be used as a clue for beam connection.

As described in detail above, according to the present invention, the positioning error from the position in design of a shaped beam with an arbitrary section can be detected for a short time and corrected, and such a beam can be adjusted promptly and precisely. A variable shaped beam and a cell pattern beam can be positioned for a short time. Therefore, according to the present invention, the manufacturing precision and throughput can be greatly enhanced in manufacturing a semiconductor device provided with a pattern in which a pattern formed by a cell pattern beam and a pattern formed by a variable shaped beam are mixed.

Some embodiments according to the present invention are described above; however, the present invention is not limited to only these embodiments, but as long as the basic concept of the present invention is not changed, it need scarcely be said that many variations and applications are allowed.

What is claimed is:

1. A charged particle beam delineating method for delineating a pattern on the surface of a delineated target using a shaped beam, comprising:

a process for measuring the point of the center of intensity distribution of said shaped beam projected on the surface of said delineated target;

a process for calculating a position correcting amount for correcting the projected position on the surface of said delineated target of said shaped beam based upon the measured point of the center of intensity distribution;

a process for correcting the projected position on the surface of said delineated target of said shaped beam by the obtained position correcting amount; and a process for delineating a pattern on the surface of said delineated target using said shaped beam, the projected position of which is corrected.

2. A charged particle beam writing method for writing a pattern on the surface of a written target using the shaped beam, comprising:

a process for measuring the point of the center of intensity distribution of said shaped beam projected on the surface of said written target;

a process for calculating a position correcting amount for correcting the projected position on the surface of said written target of said shaped beam based upon the measured point of the center of intensity distribution;

a process for correcting the projected position on the surface of said written target of said shaped beam by the obtained position correcting amount; and a process for writing a pattern on the surface of said written target using said shaped beam, the projected position of which is corrected.

3. A charged particle beam writing method according to claim 2, wherein:

said shaped beam is a variable shaped beam.

4. A charged particle beam writing method according to claim 2, wherein:

said shaped beam is a cell pattern beam.

5. A charged particle beam writing method for writing a pattern on the surface of a written target using a variable shaped beam and a cell pattern beam, comprising:

a process for measuring the point of the center of intensity distribution of said variable shaped beam and said cell pattern beam projected on the surface of said written target;

a process for calculating a projected position correcting amount based upon the respective measured points of the center of intensity distribution of said variable shaped beam and cell pattern beam for correcting the projected position on the surface of said written target of said cell pattern beam for the projected position on the surface of said written target of said variable shaped beam;

a process for correcting the projected position on the surface of said written target of said cell pattern beam by the obtained projected position correcting amount; and a process for writing a pattern on the surface of said written target using said variable shaped beam and said cell pattern beam, the projected position of which is corrected.

6. A charged particle beam delineating apparatus for delineating a pattern on the surface of a delineated target using a shaped beam, comprising:

means for measuring the point of the center of intensity distribution of said shaped beam projected on the surface of said delineated target;

means for calculating a projected position correcting amount for correcting the projected position on the surface of said delineated target of said shaped beam based upon the measured point of the center of intensity distribution;

means for correcting the projected position on the surface of said delineated target of said shaped beam by the obtained projected position correcting amount; and means for delineating a pattern on the surface of said delineated target using said shaped beam, the projected position of which is corrected.

7. A charged particle beam writing apparatus for writing a pattern on the surface of a written target using a shaped beam, comprising:

means for measuring the point of the center of intensity distribution of said shaped beam projected on the surface of said written target;

means for calculating a projected position correcting amount for correcting the projected position on the surface of said written target of said shaped beam based upon the measured point of the center of intensity distribution;

means for correcting the projected position on the surface of said written target of said shaped beam by the obtained projected position correcting amount; and means for writing a pattern on the surface of said written target using said shaped beam, the projected position of which is corrected.

8. A charged particle beam writing apparatus according to claim 7, wherein:

said shaped beam is a variable shaped beam.

9. A charged particle beam writing apparatus according to claim 7, wherein:

said shaped beam is a cell pattern beam.

10. A charged particle beam writing apparatus for writing a pattern on the surface of a written target using a variable shaped beam and a cell pattern beam, comprising:

means for measuring the point of the center of intensity distribution of said variable shaped beam and cell pattern beam projected on the surface of said written target;

means for calculating a projected position correcting amount based upon the respective measured points of the center of intensity distribution of said variable shaped beam and said cell pattern beam for correcting the projected position on the surface of said written target of said cell pattern beam for the projected position on the surface of said written target of said variable shaped beam;

means for correcting the projected position on the surface of said written target of said cell pattern beam by the obtained projected position correcting amount; and means for writing a pattern on the surface of said written target using said variable shaped beam and said cell pattern beam, the projected position of which is corrected.

11. A charged particle beam delineating method for delineating a pattern on the surface of a delineated target using a shaped beam, comprising:

a process for measuring the point of the center of intensity distribution of said shaped beam projected on the surface of said delineated target, changing the focal position on the surface of said delineated target of said shaped beam; and a process for adjusting the beam axis of said shaped beam so that the point of the center of intensity distribution of said shaped beam projected on the surface of said delineated target is not varied by the change of the focal position of said shaped beam on the surface of said delineated target.

12. A charged particle beam writing method for writing a pattern on the surface of a written target using a shaped beam, comprising:

a process for measuring the point of the center of intensity distribution of said shaped beam projected on the surface of said written target, changing the focal position on the surface of said written target of said shaped beam; and a process for adjusting the beam axis of said shaped beam so that the point of the center of intensity distribution of said shaped beam projected on the surface of said written target is not varied by the change of the focal position on the surface of said written target of said shaped beam.

13. A charged particle beam writing method according to claim 12, wherein:

said shaped beam is a variable shaped beam.

14. A charged particle beam writing method according to claim 12, wherein:

said shaped beam is a cell pattern beam.

15. A charged particle beam delineating apparatus for delineating a pattern on the surface of a delineated target using a shaped beam, comprising:

means for measuring the point of the center of intensity distribution of said shaped beam projected on the surface of said delineated target, changing the focal position on the surface of said delineated target of said shaped beam; and means for adjusting the beam axis of said shaped beam so that the point of the center of intensity distribution of said shaped beam projected on the surface of said delineated target is not varied by the change of the focal position on the surface of said delineated target of said shaped beam.

16. A charged particle beam writing apparatus for writing a pattern on the surface of a written target using a shaped beam, comprising:

means for measuring the point of the center of intensity distribution of said shaped beam projected on the surface of said written target, changing the focal position on the surface of said written target of said shaped beam; and means for adjusting the beam axis of said shaped beam so that the point of the center of intensity distribution of said shaped beam projected on the surface of said written target is not varied by the change of the focal position on the surface of said written target of said shaped beam.

17. A charged particle beam writing apparatus according to claim 16, wherein:

said shaped beam is a variable shaped beam.

18. A charged particle beam writing apparatus according to claim 16, wherein:

said shaped beam is a cell pattern beam.

* * * * *